United States Patent [19]
Wittekoek et al.

[11] Patent Number: 5,100,237
[45] Date of Patent: Mar. 31, 1992

[54] APPARATUS FOR PROJECTING A MASK PATTERN ON A SUBSTRATE

[75] Inventors: Stefan Wittekoek, Bergeyk; Marinus A. van den Brink, Eindhoven, both of Netherlands

[73] Assignee: ASM Lithography, Veldhoven, Netherlands

[21] Appl. No.: 529,046

[22] Filed: May 25, 1990

Related U.S. Application Data

[63] Continuation-in-part of Ser. No. 513,691, Apr. 24, 1990, abandoned.

[30] Foreign Application Priority Data

Apr. 20, 1989 [NL] Netherlands ................. 8900991

[51] Int. Cl.$^5$ ............................................. G01B 9/02
[52] U.S. Cl. ................................... 356/401; 356/400; 250/557
[58] Field of Search .................. 356/400, 401; 250/557

[56] References Cited

U.S. PATENT DOCUMENTS 4,778,275 10/1988 van den Brink et al. ............ 356/401
4,795,244 1/1989 Uehara et al. ........................ 356/401

Primary Examiner—Samuel Turner
Assistant Examiner—Richard E. Kurtz, II

[57] ABSTRACT

An apparatus for projecting a mask pattern (MA) on a substrate (W) by means of a projection lens system (PL) is described, which apparatus comprises a device for aligning a substrate alignment mark ($P_1$; $P_2$) with respect to a mask alignment mark ($M_1$; $M_2$), the projection lens system (PL) forming part of the alignment device. A correction element (25) is arranged in this system (PL) to compensate for the fact that this system (PL) is not optimized for the wavelength of the alignment beam (b).

34 Claims, 7 Drawing Sheets

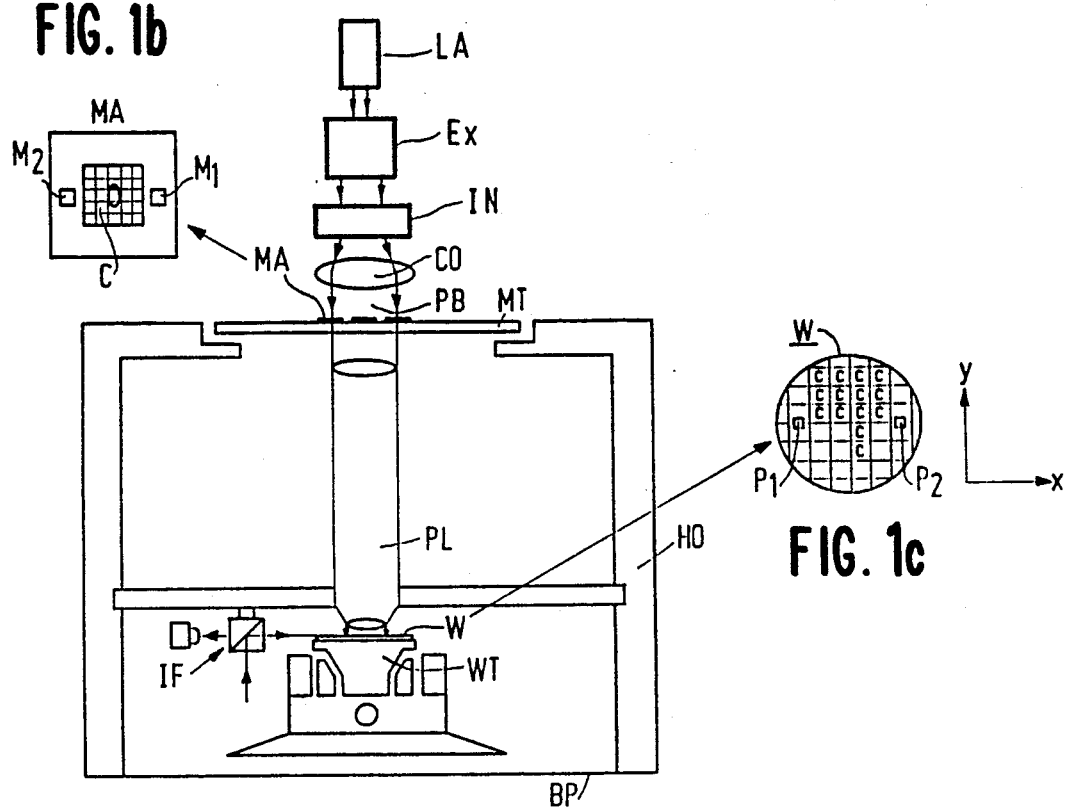
FIG. 1b
FIG. 1a
FIG. 1c
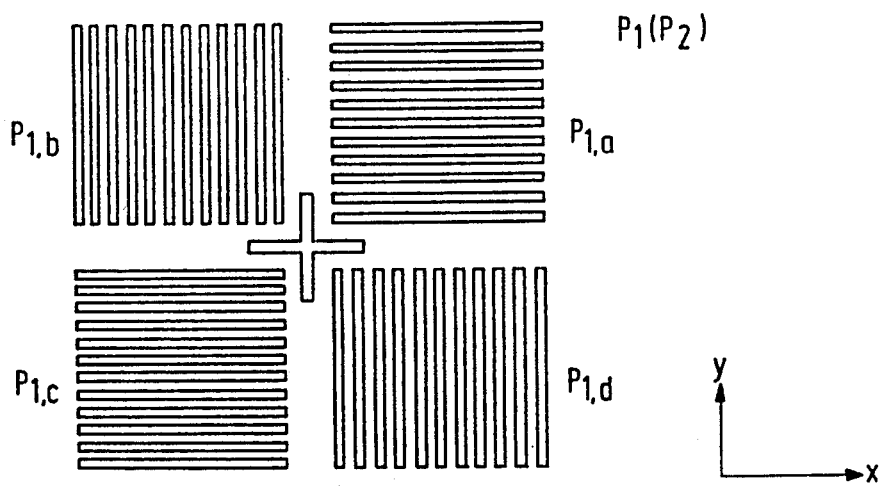
FIG. 2
PRIOR ART

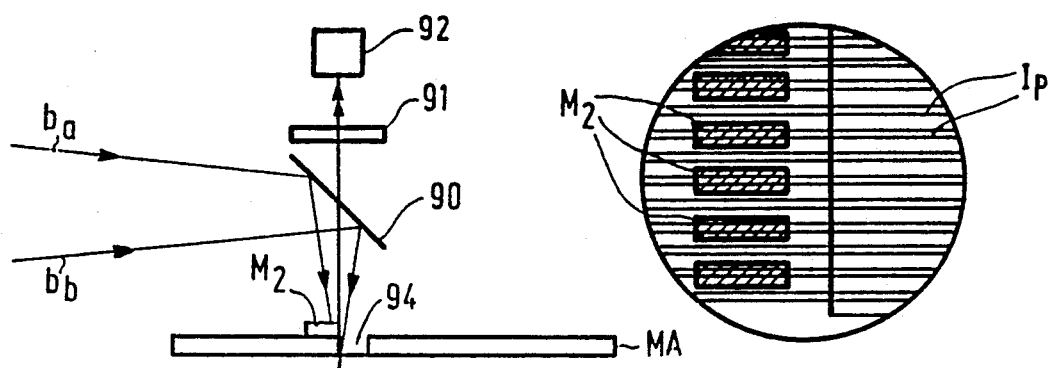
FIG. 12b
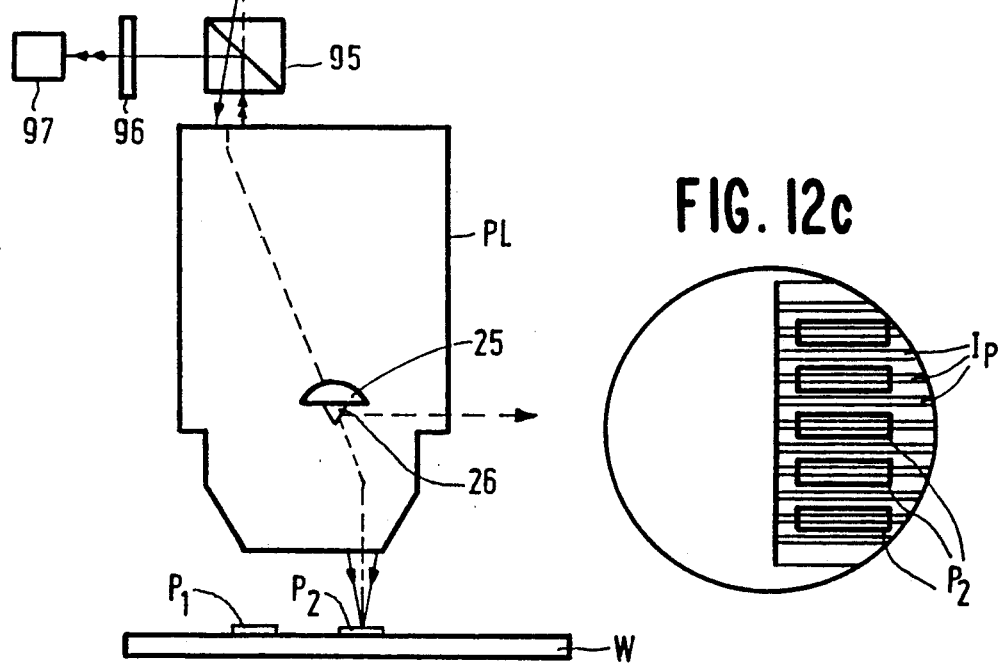
FIG. 12c
FIG. 12a

APPARATUS FOR PROJECTING A MASK PATTERN ON A SUBSTRATE

This is a continuation-in-part of application Ser. No. 513,691, filed Apr. 24, 1990, now abandoned.

The invention relates to an apparatus for projecting a mask pattern on a substrate, which apparatus successively comprises an illumination system for supplying a projection beam, a mask holder, a projection lens system and a substrate holder and which further comprises a device for aligning a substrate alignment mark with respect to a mask alignment mark, said device comprising a radiation source supplying an alignment beam, the projection lens system and a radiation-sensitive detection system in the path of alignment beam portions which have been in interaction with the mask alignment mark and the substrate alignment mark, the output signals of the detection system being a measure of the mutual position of the alignment marks.

Aligning a mask alignment mark and a substrate alignment mark with respect to each other is understood to mean both directly and indirectly aligning these alignment marks with respect to each other. In the case of direct alignment, a mask alignment mark or a substrate alignment mark, is projected on the other mark, the substrate alignment mark or mask alignment mark, and the radiation-sensitive detection system is arranged behind said other alignment mark. In the case of indirect alignment, both the substrate alignment mark and the mask alignment mark are projected on, for example, different parts of a further alignment mark, while the radiation-sensitive detection system is arranged behind the further alignment mark and the extent to which the substrate alignment mark and the mask alignment mark are aligned with respect to each other is determined by detecting to what extent the substrate and mask alignment marks are aligned with respect to the further alignment mark.

An apparatus of this type is described in U.S. Pat. No. 4,778,275 which relates to an apparatus for repetitive and reduced projection of a mask pattern, for example, the pattern of an integrated circuit (IC) on one and the same substrate, while the mask pattern and the substrate are moved with respect to each other between two successive illuminations, for example along two mutually perpendicular directions in a plane parallel to the substrate plane and the mask plane.

Integrated circuits are manufactured by means of diffusion and masking techniques. A number of masks with different mask patterns are consecutively projected on one and the same location on a semiconductor substrate. Between the consecutive projections on the same locations the substrate must undergo the desired physical and chemical processes. To this end the substrate must be removed from the apparatus after it has been illuminated with a mask pattern, and after it has undergone the desired process steps it must be placed in the apparatus again in the same position so as to illuminate it with a second mask pattern, and so forth, while it must be ensured that the projections of the second mask pattern and the subsequent mask patterns are positioned accurately with respect to the substrate.

Diffusion and masking techniques can also be used in the manufacture of other structures having detailed dimensions of the order of micrometers, for example, structures of integrated optical systems or guiding and detection patterns of magnetic domain memories and structures of liquid crystal display panels. In the manufacture of these structures the projections of mask patterns must also be aligned very accurately with respect to a substrate.

In connection with the large number of electronic components per unit of surface area of the substrate and the resultant small dimensions of these components, increasingly stricter requirements are imposed on the accuracy with which the integrated circuits are manufactured. The position where the consecutive masks are projected on the substrate must therefore be established more and more accurately.

In order to be able to realise the desired, very precise positioning accuracy within several tenths of one micrometer in the apparatus according to U.S. Pat. No. 4,778,275 of the projection of the mask pattern with respect to the substrate, this apparatus comprises a device for aligning the substrate with respect to the mask pattern with which an alignment mark provided in the substrate is projected on an alignment mark provided in the mask. If the projection of the substrate alignment mark accurately coincides with the mask alignment mark, the substrate is correctly aligned with respect to the mask pattern. The main element for projecting the substrate mark on the mask mark is constituted by the projection lens system, or imaging system with which the mask pattern is projected on the substrate. Due to the ever increasing demand for more electronic components per unit of surface area of the substrate, hence for even smaller dimensions of these components, there is an ever increasing need of an apparatus which can make projections in a repetitive manner whose details or linewidths are considerably smaller than one micrometer, for example, of the order of 0.2 to 0.3 micrometer. This means that the resolving power of the projection lens system must be increased. As is known, this resolving power is proportional to $NA/\lambda$ in which NA is the numerical aperture of the projection lens system and $\lambda$ is the wavelength of the projection beam. The numerical aperture is already fairly high, for example, $NA=0.48$ for the known projection lens system.

Another important factor is that the depth of focus of the system of lenses, which should be as large as possible, is given by $\lambda/NA^2$ so that an enlargement of the numerical aperture is more detrimental for the depth of focus than a reduction of the wavelength.

Substantially the only possibility which is then left for realising the desired projections with details of 0.2–0.3 micrometer with the desired depth of focus is to make use of a projection beam having a considerably smaller wavelength than has hitherto been conventional. In order to be able to project the mask pattern on the substrate by means of such a shortwave beam, lens elements of quartz must be used. Since quartz is very dispersive, the radiation used should have a very narrow wavelength band. Therefore, a radiation source will have to be used which emits a large power within a narrow wavelength band. A real possibility then is the use of an excimer laser, for example, a crypton fluoride laser having a wavelength of 248 nm, an argon fluoride laser having a wavelength of 193 nm, or an Nd-YAG laser whose frequency is quadrupled and which has a wavelength of 256 nm.

As has been noted in U.S. Pat. No. 4,778,275 a helium-neon laser beam with a wavelength of 633 nm is preferably used as an alignment beam, because such a beam cannot cause any change in the photoresist provided on the substrate and because it is not weakened by this photoresist. The projection lens system is optimally corrected for the projection beam wavelength and may form a sharp projection of the mask pattern on the substrate. However, due to the different wavelength of the alignment beam the substrate and the mask cannot be sharply projected on each other by this beam and the projection lens system. The sharp projection of a substrate alignment mark formed by the projection lens system is located at some distance from the associated mask alignment mark. The result is that the aligning signal, which is derived from the signals of the radiation-sensitive detection system, is no longer determined by alignment errors only but is also influenced by, for example, tilting of the substrate or by instabilities of the alignment beam. When displacing a substrate alignment mark with respect to a mask alignment mark in such way that the alignment signal has the desired value, an alignment error may then subsist.

In order to achieve that a substrate alignment mark is nevertheless sharply projected on a mask alignment mark in spite of the non-optimum wavelength of the alignment beam for projection, it is proposed in U.S. Pat. No. 4,778,275 to arrange an additional correction element in the radiation path of the alignment beam behind the projection lens system, in which correction element the radiation path is folded so that the optical path length for the alignment beam is enlarged. The combination of the projection lens system and the correction element enables the substrate alignment mark to be sharply projected on the mask alignment mark.

However, in practice this correction method can only be used if the difference between the optical lengths for the projection beam and the aligning beam is not too large. This path length difference is given by $\Delta n \times \Delta \lambda$, in which $\Delta \lambda$ is the difference between the wavelengths of the alignment beam and the projection beam and $\Delta n$ is the effective difference between the refractive indices of the material of the projection lens system for these two wavelengths. In a device in which an excimer laser beam is used as a projection beam and a helium neon laser beam is used as an alignment beam, $\Delta \lambda$ is not only large but $\Delta n$ is also very large for the lens material, quartz, to be used. This $\Delta n$ cannot be reduced by combining different lens materials, as is possible for optical glasses. The product $\Delta \lambda . \Delta n$ is extremely large in this case, which leads to path length differences of, for example, the order of 2 m. Even if the alignment beam were folded several times in the known correction element, this element would have to be so large that the projection apparatus lacks the space for it. Even more important is that such a large element is very sensitive to mechanical instabilities, such as tilting of the element, and to temperature variations.

To compensate for the path length difference, an extra lens could also be arranged in the radiation path of the alignment beam behind the projection lens system. This lens should then have a very large power and would therefore also be very sensitive to mechanical and thermal instabilities.

The present invention has for its object to provide a device for aligning a substrate alignment mark with respect to a mask alignment mark in which simple, well-stabilised means, which require hardly any extra space, can satisfactorily correct for the said focusing error. To this end this device is characterized in that a refractive correction element is arranged in the path of the alignment beam and in the projection lens system, the dimension of said correction element being considerably smaller than the diameter of the projection lens system, said correction element focusing only the sub-beams of the alignment beam which are deflected in the first diffraction orders by a first alignment mark onto a second alignment mark.

The first alignment mark is the mark projected on another mark. In the case of direct alignment, the second alignment mark is a mask alignment mark or a substrate alignment mark, and in the case of indirect alignment it is a further alignment mark.

The apparatus according to the invention is preferably further characterized in that the refractive correction element is arranged in the Fourier plane of the projection lens system.

The projection lens system is a composite lens system having a large number of lens elements which may be considered to be arranged in a first group and in a second group. The Fourier plane is present between these groups of lens elements. The first group forms a so-called Fourier transform in the Fourier plane of an object, in this case an alignment mark, while the second group of lens elements retransforms this Fourier transform into an image of the object. The various diffraction order portions of the alignment beam which are formed by the object are focused and separated from one another in the Fourier plane.

Moreover, the correction element is so small and arranged at such a position that it has a negligible influence on the projection beam and on the mask image formed with this beam.

Since the correction element is a refractive element, which influences the direction of the rays passing therethrough and thus directly displaces the position of the point at which these rays are combined, this correction element in itself is already more effective than the correction element hitherto used which only folds the radiation path. Moreover, since the refractive correction element is arranged at a relatively large distance from the second alignment mark, its effectiveness is considerably increased. The optical power of this element can therefore remain limited so that it is considerably less sensitive to mechanical and thermal instabilities.

An additional advantage of the novel correction element is that this element operates as a spatial filter for the first diffraction orders in the imaging of the first alignment mark because it deflects only the portions of the alignment beam to the second alignment mark that are diffracted in the first orders. As a result, known advantages are obtained without having to arrange a separate first order filter in the radiation path, as in known devices. The said advantages are: the contrast with which the first alignment mark is imaged on the second alignment mark is increased, possible irregularities in the first alignment mark do not have any influence on the alignment signal obtained and the accuracy with which the two marks are aligned with respect to each other is twice as large as in the case of using also the zero order sub-beam of the alignment beam for the imaging.

The refractive correction element may have various shapes and may consist of, for example, a double optical wedge.

A preferred embodiment of the apparatus is characterized in that the refractive correction element is a lens.

With such a correction lens it is not only possible to correct the position of the point of focus but also the magnification with which a first alignment mark is imaged can be corrected for the greater part.

The magnification error correction thus obtained will be sufficient in many cases. If it is desirable in certain circumstances to correct for residual magnification errors, the device is further characterized in that an extra lens for correcting the magnification with which the first alignment mark is imaged on the second alignment mark is arranged in the radiation path of the alignment beam between the first and second alignment marks and outside the projection lens system.

Initially the invention arose from the need for a projection apparatus in which the projection beam has a wavelength in the far ultraviolet range of the spectrum, while the alignment beam is a red beam. In that case the alignment beam portions with the different diffraction orders are sufficiently separated so that only the first order portions reach the second alignment mark. However, the invention may also be used to great advantage in an apparatus in which the projection beam has a longer wavelength and thus the difference between the wavelengths of the projection beam and the alignment beam is smaller so that achromatic or colour-corrected lenses can in principle be used as in, for example, the apparatus according to U.S. Pat. No. 4,778,275. The voluminous correction element of the last-mentioned apparatus, which is liable to strict tolerance requirements, is then replaced by the smaller correction element according to the invention on which less strigent requirements are imposed. Moreover, this apparatus does not require a separate lens for the first order correction of magnification errors because this correction is already ensured by the novel correction element.

Since this lens only needs to realise a small correction, it has only a small power so that stability requirements which must be imposed on this lens are considerably less stringent than those which must be imposed on a corresponding lens in the device according to U.S. Pat. No. 4,778,275.

In accordance with a further characteristic feature the extra lens is arranged proximate to the first alignment mark or proximate to the second alignment mark.

The extra, or magnification error correction lens is most effective when it is arranged proximate to the object, i.e. one of the alignment marks, or proximate to the image, i.e. the other alignment mark.

A preferred embodiment of the apparatus is further characterized in that the extra lens is arranged between the projection lens system and a mask alignment mark. In practice, the space in a projection apparatus available between the mask and the projection lens system will be larger than the space between this projection lens system and the substrate.

As has already been stated, the refractive correction element should ensure that in any case alignment radiation of the first diffraction orders reaches the second alignment mark.

However, particularly with a smaller difference between the wavelengths of the projection beam and the alignment bean and with the use of achromatic lens elements, radiation having diffraction orders which are higher than the first orders could reach the second alignment mark. An embodiment of the apparatus in which this is prevented is characterized in that a diaphragm is arranged in the projection lens system, which diaphragm blocks those portions of the alignment beam coming from the first alignment mark which have diffraction orders which are higher than one.

This diaphragm is arranged proximate to the correction element and preferably in the plane of this element.

A first embodiment of this apparatus is characterized in that the diaphragm is constituted by a layer which is transparent to the projection beam and the alignment beam, which layer has regions blocking the radiation of the alignment beam at those positions where the portions of the alignment beam with diffraction orders higher than one reach said layer.

The total surface area of the said regions, which must substantially block the radiation of the alignment beam deflected in the third and fifth orders, is only 5 to 10% of the surface area of the pupil of the projection lens system so that these regions only have a negligible influence on the projection beam. The said layer may be of the same material as the lenses, while the regions are formed, for example, by small pads of absorbing material.

A second embodiment of the apparatus having a diaphragm in the plane of the correction element is characterized in that the diaphragm is constituted by a layer of dichroic material which is transparent to the projection beam and opaque to the alignment beam, which layer has regions which are transparent to the alignment beam at those positions where the first diffraction order portions of the alignment beam reach said layer.

This diaphragm has the advantage that it does not comprise any obstacles for the projection beam and is more effective at blocking the diffraction orders of the alignment beam which are higher than the first orders.

Alternatively to a diaphragm arranged in the projection lens system, preferably in the plane of the correction element, there are other possibilities to achieve that the image of the first alignment mark on the second alignment mark observed by the detection system is only realised by the first diffraction order portions of the alignment beam.

A first embodiment of the apparatus according to the invention, in which this possibility is realised, is characterized in that a diaphragm is arranged between the projection lens system and the second alignment mark, which diaphragm is transparent to radiation in the region where the portions of the alignment beam diffracted in the first orders by the first alignment mark reach said diaphragm.

Since the diaphragm is arranged outside the projection lens system and close to the projection of the first alignment mark, it may occur under circumstances that radiation diffracted in higher orders, notably in the third and fifth orders of the alignment beam passes through the diaphragm apertures and reaches the detection system. To prevent this, the last-mentioned embodiment may be further characterized in that a diaphragm system which only passes the portions of the alignment beam diffracted in the first orders by the first alignment mark and the second alignment mark to the radiation-sensitive detection system is arranged between the second alignment mark and said detection system.

This diaphragm system may be a diaphragm plate with apertures for the first order beam portions, but it may alternatively consists of a plurality of radiation-conducting pipes for the first diffraction orders only.

The above-mentioned different filter elements for the first order beam portions can also be combined.

The diameter of the correction element is, for example, smaller than one tenth of that of the projection lens system and this correction element is arranged at such a position within the projection lens system that this element influences the radiation path of the projection beam as little as possible so that the quality of the image of the mask pattern on the substrate is maintained as satisfactorily as possible. Under circumstances the apparatus according to the invention may be further characterized in that the illumination system supplies a projection beam which has an annular cross-section in the plane of the correction element in the projection lens system. It can then be ensured that the internal diameter of the annular cross-section at the area of the correction element is larger than the surface area of the correction element.

There are different main embodiments of the apparatus according to the invention, which embodiments are distinguished from each other in the way in which the substrate and mask alignment marks are projected on each other and possibly on a further alignment mark.

A first main embodiment is characterized in that the first alignment mark is a mask alignment mark and the second alignment mark is a substrate alignment mark, and in that a reflector is arranged in the path of alignment sub-beam portions, which are diffracted firstly by the mask in the first order and subsequently by the substrate alignment mark in the first order, said reflector only reflecting said alignment sub-beam portions towards a detection system.

A second main embodiment of the apparatus is characterized in that the second alignment mark is formed by a further alignment mark located outside the substrate and the mask and in that a mask alignment mark as well as a substrate alignment mark are a first alignment mark, both of which are projected on the further mark.

A third main embodiment is characterized in that the radiation source of the alignment device supplies two radiation beams forming an interference pattern in the plane of the mask alignment mark and in the plane of the substrate alignment mark, in that the first alignment mark is formed by a part of said interference pattern and in that the second alignment mark is formed by a substrate alignment mark.

In this embodiment another part of the interference pattern is projected on the mask alignment mark and the extent of alignment of the mask alignment mark with respect to the substrate alignment mark is determined by the position of both the mask alignment mark and the substrate alignment mark with respect to said pattern.

A fourth main embodiment of the projection apparatus is characterized in that the first alignment mark is a substrate alignment mark and the second alignment mark is a mask alignment mark, and in that a reflector for reflecting the alignment beam towards substrate alignment mark is arranged between the correction element and said mark.

This embodiment is preferably further characterized in that the correction element is located in the rear focal plane of the projection lens system.

The rear focal plane is the focal plane at the side of the substrate. It has been assumed that the projection lens system is telecentric at its substrate side, which is often the case in the current projection apparatuses.

In the last-mentioned main embodiment the alignment beam can be introduced in different manners in the radiation path between the substrate alignment mark and the mask alignment mark. A first possibility is to arrange a reflector between the mask table and the projection lens system for reflecting the alignment beam into the projection lens system. The apparatus is further characterized in that a diaphragm system, which blocks the portions with diffraction orders of more than one as well as the zero order portion of the alignment beam coming from a substrate alignment mark is arranged between the projection lens system and the detection system.

A second possibility of reflecting the aligning beam in the projection lens system is realised in an embodiment which is characterized in that the holder of the projection lens system has a radiation-transparent window through which the alignment beam can enter transversally with respect to the optical axis of this system and in that a reflector for reflecting the entering alignment beam to the substrate table is arranged in the projection lens system.

As described in U.S. Pat. No. 4,778,275, an apparatus for projecting a mask pattern on a substrate preferably comprises the said device for aligning a first mask alignment mark with respect to a substrate alignment mark as well as a second analog device for aligning a second mask alignment mark with respect to a substrate alignment mark by means of a second alignment beam. Then the relative angle orientation of the mask pattern and the substrate can be laid down directly and optically and the magnification with which the projection lens system images the mask pattern on the substrate can be determined. Such an apparatus in which the invention is used is characterized in that the first and second alignment devices have one common correction element.

This apparatus may be further characterized in that the reflector has a first and a second reflecting face for reflecting the first and second alignment beams, respectively, to the substrate table, said faces extending at equally large but opposite angles to the optical axis of the projection lens system and in that the holder of the projection lens system has two radiation-transparent windows situated opposite the said reflecting faces.

The first and second alignment beams can be supplied by separate radiation sources and introduced into the radiation path between the mask alignment marks and substrate alignment marks via separate elements, for example, by introducing radiation into the holder of the projection lens system via the said radiation-transparent windows.

However, the apparatus may be further characterized in that the first and second alignment devices have one common radiation source for supplying two alignment beams which reach one and the same radiation-transparent window in the holder of the projection lens system from different directions, whereafter one of the alignment beams is directly incident on one of the reflecting faces, while the other alignment beam leaves the said holder via the second radiation-transparent window and is incident on an additional reflector which reflects this alignment beam to the second reflecting face.

An apparatus comprising a double alignment device, in which a mask alignment mark is projected on a substrate alignment mark, may be further characterized in that the first and the second alignment device have a reflector in common for reflecting beam portions of double diffraction orders $(+1, -1)$ and $(-1, +1)$ of the alignment beams towards associated detection systems, the first and the second number of the diffraction orders being associated with a mask alignment mark and a substrate alignment mark, respectively.

A preferred embodiment of the apparatus is further characterized in that the substrate marks are constituted by phase diffraction gratings and in that the mask marks are constituted by amplitude diffraction gratings.

As described in U.S. Pat. No. 4,251,160, periodical gratings as compared with other alignment marks such as, for example, square marks or perpendicularly intersecting strips have the advantage that when measuring position errors averaging over the gratings occurs. As a result it is possible to align accurately, even if the gratings have irregularities, such as deviations from the nominal width of the grating strips and/or, in the case of profile gratings, deviations from the nominal profile of the grating grooves. The substrate gratings are only to be provided once for the entire manufacturing cycle of an integrated circuit and need not be provided in each newly provided layer. As compared with amplitude gratings, phase gratings on the substrate have the advantage that they remain well "visible". Moreover, the phase gratings are well resistant to the large number of diffusion processes to which the substrate must be subjected during the manufacture of integrated circuits.

By combining grating-shaped alignment marks and filtering the first order sub-beams it is achieved that the aligning signal is not influenced by higher order deviations of the grating shapes.

The preferred embodiment of the device according to the invention may be further characterized in that means controlled by periodical signals are arranged in the radiation path of an alignment beam for periodically displacing a second alignment mark observed by the detection system and the image on this mark of a first alignment mark with respect to each other. In the case of grating marks the displacement is of the order of half a period of the second alignment mark.

The said means may be constituted by a drive member for the mask so that the mask alignment mark is periodically moved, or by a polarisation modulator in combination with polarisation-sensitive elements which ensure that the projection of the substrate alignment mark is effectively oscillated across a mask alignment mark. By periodically displacing the projection of the first alignment mark observed by the detection system with respect to the second alignment mark; a dynamic alignment signal is obtained and the accuracy and sensitivity of the device are considerably improved. The latter is important if, for example, the substrate alignment marks only reflect to a weak extent. The mutual movement of the alignment marks may be alternatively realised by making use of a "running" interference pattern which functions as the first alignment mark.

Embodiments of the invention will now be described in greater detail with reference to the accompanying drawings in which FIG. 1a shows an embodiment of an apparatus for repetitive imaging of a mask pattern on a substrate, FIG. 1b shows a mask for use with the apparatus of FIG. 1a, FIG. 1c shows a substrate for use with the apparatus of FIG. 1a, FIG. 2 shows a known embodiment of an alignment mark in the form of a two-dimensional grating, FIG. 3 shows a first embodiment of an apparatus according to the invention comprising two alignment devices, FIG. 4 shows the operation of the correction lens used in this apparatus, FIGS. 5 and 6 show first and second embodiments of a diaphragm plate suitable for the apparatus according to the invention, FIGS. 7 and 8 show further embodiments of diaphragm elements for use in this apparatus, FIG. 9 shows a second embodiment of this apparatus, FIGS. 10, 11 and 12a show alternative embodiments of the apparatus.

FIG. 12b shows an interference pattern produced by the apparatus of FIG. 12a, and FIG. 12c shows another interference pattern produced by the apparatus of FIG. 12a.

FIG. 1a shows an embodiment of an apparatus for repetitively imaging a mask pattern on a substrate. The main components of this apparatus are a projection column, in which a mask pattern C to be imaged is arranged and a movable substrate table WT with which the substrate can be positioned with respect to the mask pattern C.

The projection column incorporates an illumination system which comprises, for example, a laser LA, a beam widener $E_x$, an element IN, also referred to as integrator which produces a homogeneous distribution of radiation within the projection beam PB and a condensor lens CO. The projection beam PB illuminates the mask pattern C present in the mask M, which mask is arranged on a mask table MT.

The beam PB passing through the mask pattern C traverses a projection lens system PL arranged in the projection column and shown only diagrammatically, which system forms a an image of the pattern C on the substrate W. The projection lens system has, for example a magnification $M=1/5$, a numerical aperture $N.A.=0.48$ and a diffraction-limited image field with a diameter of 22 mm.

The substrate W is arranged on a substrate table WT supported in, for example, air bearings. The projection lens system PL and the substrate table WT are arranged in a housing HO which is closed at its lower side by a baseplate BP of, for example granite and at its upper side by the mask table MT.

As is shown in FIG. 1b, the mask MA has two alignment marks $M_1$ and $M_2$. These marks preferably consist of diffraction gratings, but they may be alternatively formed by other marks such as squares or strips which are optically distinguished from their surroundings. The alignment marks are preferably two-dimensional, i.e. they extend in two mutually perpendicular directions, the X and Y directions. The substrate W, for example, a semiconductor substrate on which the pattern C must be projected side by side for a number of times comprises a plurality of alignment marks, preferably also two-dimensional diffraction gratings, two of which, $P_1$ and $P_2$, are shown in FIG. 1c. The marks $P_1$ and $P_2$ are located outside the regions on the substrate W where the projections of the pattern C must be formed. Preferably, the grating marks $P_1$ and $P_2$ are in the form of phase gratings and the grating marks $M_1$ and $M_2$ are in the form of amplitude gratings.

FIG. 2 shows an embodiment of one of the two identical substrate phase gratings on a larger scale. Such a grating may comprise four sub-gratings $P_{1,a}$, $P_{1,b}$, $P_{1,c}$ and $P_{1,d}$, two of which, $P_{1,b}$ and $P_{1,d}$, are used for alignment in the X direction and the two other sub-gratings, $P_{1,a}$ and $P_{1,c}$, are used for alignment in the Y direction. The two sub-gratings $P_{1,b}$ and $P_{1,c}$ have a grating period of, for example, 16 μm and the sub-gratings $P_{1,a}$ and $P_{1,d}$ have a grating period of, for example, 17.6 μm. Each sub-grating may have a dimension of, for example, 200×200 μm. An alignment accuracy which in principle is less than 0.1 μm can be achieved with this grating and a suitable optical system. Different grating periods have been chosen so as to increase the capture range of the alignment device.

Figure 3:
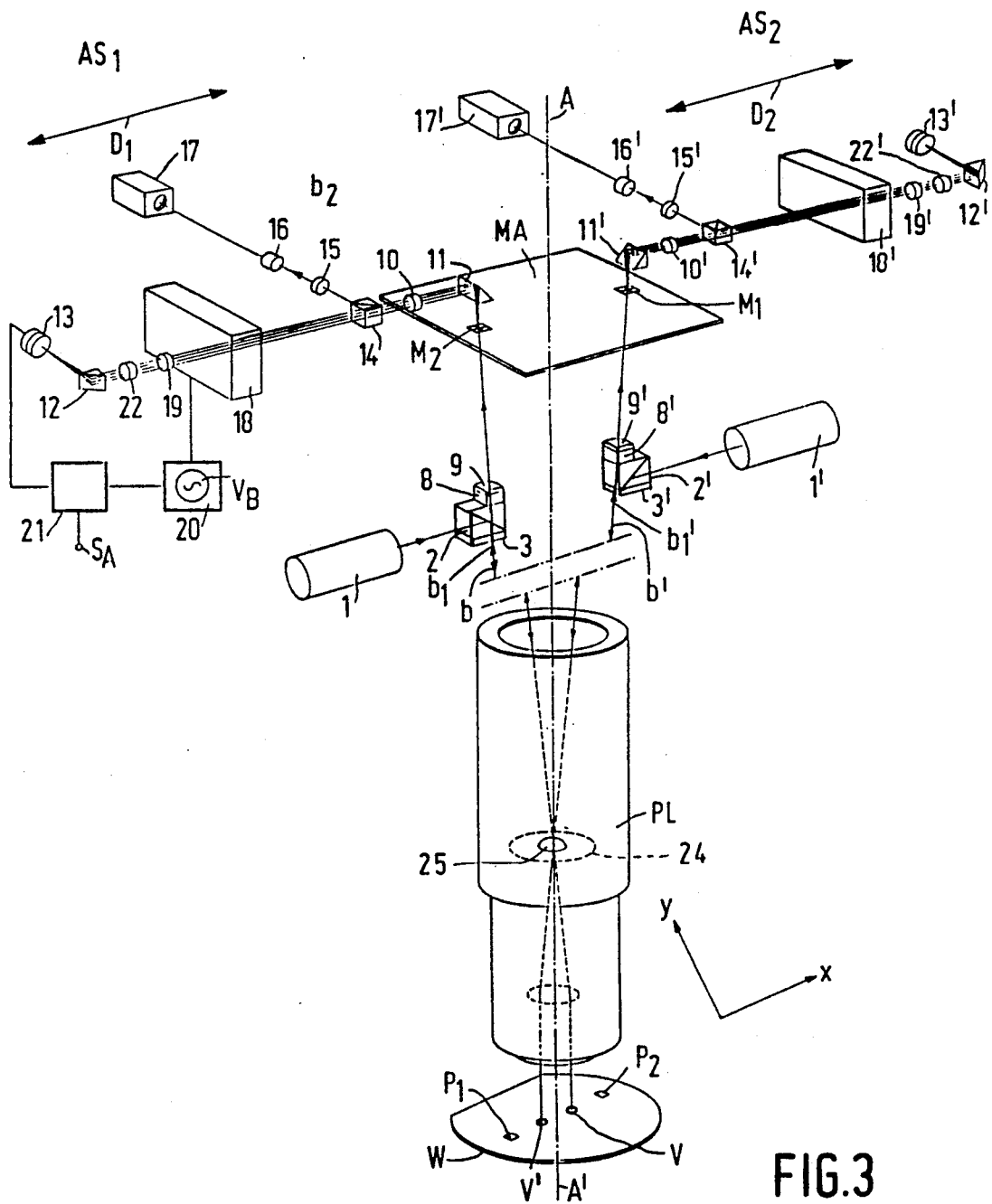

FIG. 3 shows the optical elements which are used for aligning in a first embodiment of the apparatus according invention. This apparatus comprises two separate and identical alignment systems $AS_1$ and $AS_2$ which are positioned symmetrically with respect to the optical axis AA' of the projection lens system PL. The alignment system $AS_1$ is associated with the mask alignment mark $M_2$ and the alignment system $AS_2$ is associated with the mask alignment mark $M_1$. The corresponding elements of the two alignment systems are denoted by the same reference numerals, those of the system $AS_2$ being distinguished from those of the system $AS_1$ by their primed notation.

The structure of the system $AS_1$ as well as the way in which the mutual position of the mask mark $M_2$ and, for example, the substrate mark $P_1$ is determined will now be described.

The alignment system $AS_1$ comprises a radiation source 1, for example, a helium-neon laser which emits an alignment beam b. This beam is reflected towards the substrate W by a beam splitter 2. The beam splitter may be a semi-transparent mirror or a semi-transparent prism, but it is preferably a polarisation-sensitive splitting prism which is succeeded by a $\lambda/4$ plate 3 in which $\lambda$ is the wavelength of the beam b. The projection lens system PL focuses the beam b to a small radiation spot V having a diameter of the order of 1 mm on the substrate W. This substrate reflects a part of the beam as beam $b_1$ in the direction of the mask M. The beam $b_1$ traverses the projection lens system PL, which system projects the radiation spot V on the mask. Before the substrate is arranged in the illumination apparatus it has been pre-aligned in a pre-aligning station coupled to the apparatus, for example, the station described in European Patent Application no. 0,164,165, so that the radiation spot V is located on the substrate mark $P_2$. This mark is then imaged by the beam $b_1$ on the mask mark $M_2$. Taking the magnification M of the projection lens system into account, the dimension of the mask mark $M_2$ is adapted to that of the substrate mark $P_2$ so that the image of the mark $P_2$ accurately coincides with the mark $M_2$ if the two marks are mutually positioned in the correct manner.

On its path to and from the substrate W the beam b and $b_1$ has traversed twice the $\lambda/4$ plate 3 whose optical axis extends at an angle of 45° to the direction of polarisation of the linearly polarised beam b coming from the source 1. The beam $b_1$ passing through the $\lambda/4$ plate then has a direction of polarisation which is rotated 90° with respect to the beam b, so that the beam $b_1$ is passed by the polarisation splitting prism 2. The use of the polarisation splitting prism in combination with the $\lambda/4$ plate provides the advantage of a minimum radiation loss when coupling the alignment beam into the radiation path of the alignment system.

The beam $b_1$ passed by the alignment mark $M_2$ is reflected by a prism 11 and directed, for example, by a further reflecting prism 12 towards a radiation-sensitive detector 13. This detector is, for example, a composite photodiode having, for example, four separate radiation-sensitive areas in conformity with the number of sub-gratings according to FIG. 2. The output signals of these detectors are a measure of the coincidence of the mark $M_2$ with the image of the substrate mark $P_2$. These signals may be processed electronically and used for moving the mask with respect to the substrate by means of driving systems (not shown) so that the image of the mark $P_2$ coincides with the mark $M_2$. Thus, an automatic alignment device is obtained.

A beam splitter 14 in the form of, for example, a semitransparent prism may be arranged between the prism 11 and the detector 13, which beam splitter splits a part of the beam $b_1$ as beam $b_2$. The split beam $b_2$ is then incident via, for example, two lenses 15 and 16 on a television camera 17 which is coupled to a monitor (not shown) on which the alignment marks $P_2$ and $M_2$ are visible to an operator of the illumination apparatus. This operator can then ascertain whether the two marks coincide and, if necessary he may move the substrate W by means of manipulators so as to cause the marks to coincide.

Analogously as described hereinbefore for the marks $M_2$ and $P_2$, the marks $M_1$ and $P_2$ and the marks $M_1$ and $P_1$, respectively, can be aligned with respect to each other. The alignment system $AS_2$ is used for the two last-mentioned alignments.

For details about the aligning procedure by means of the alignment systems reference is made to U.S. Pat. No. 4,778,275. As has also been described in this Patent, the alignment systems $AS_1$ and $AS_2$ are in a very close working relationship with an extremely accurately two-dimensional movement measuring system for measuring the movement of the substrate with respect to the mask during the aligning procedure. The positions of and the mutual distances between the alignment marks $P_1$ and $P_2$, $M_1$ and $M_2$ can then be laid down in a system of coordinates determined by the movement measuring system. The movement measuring system, which is denoted by IF in FIG. 1a is, for example, an interferometer system described in U.S. Pat. No. 4,251,160.

Since the projection lens system PL is designed for the wavelength of the projection beam PB, which must be as small as possible in view of the desired large resolving power, deviations occur when using this system PL for imaging the alignment marks $P_1$, $P_2$ and $M_1$, $M_2$ on each other by means of the alignment beam. For example, the substrate alignments marks $P_1$, $P_2$ will not be located in the plane of the mask pattern in which the mask alignment marks are located but will be imaged at a given distance therefrom, which distance depends on the difference between the wavelength of the projection beam and the alignment beam and on the difference between the refractive indices of the material of the projection lens elements for the two wavelengths. If the projection beam has a wavelength of, for example 248 nm and the alignment beam has a wavelength of 633 nm, this distance may be as large as 2 m. Moreover, due to the said wavelength difference a substrate alignment mark is imaged on a mask alignment mark with a magnification which deviates from the desired magnification, while the deviation increases with an increasing wavelength difference.

To correct for the said deviations, the projection column PL incorporates an extra lens, or correction lens 25 according to the invention. The correction lens is arranged at such a height in the projection column that the sub-beams of the different diffraction orders of the alignment beam, which sub-beams are formed by a substrate alignment mark, are sufficiently separated in the plane of the correction lens so as to be able to influence these sub-beams separately, while this correction lens has a negligible influence on the projection beam and the mask image formed therewith. The correction lens is preferably situated in the rear focal plane of the projection lens system. If this system is telecentric at the substrate side, this focal plane coincides with the plane of the exit pupil of this system. If, as is shown in FIG. 3, the correction lens 25 is situated in a plane 24 in which the chief rays of the alignment beams b and b' intersect one another, this lens may be simultaneously used for correcting the two alignment beams.

Figure 4:
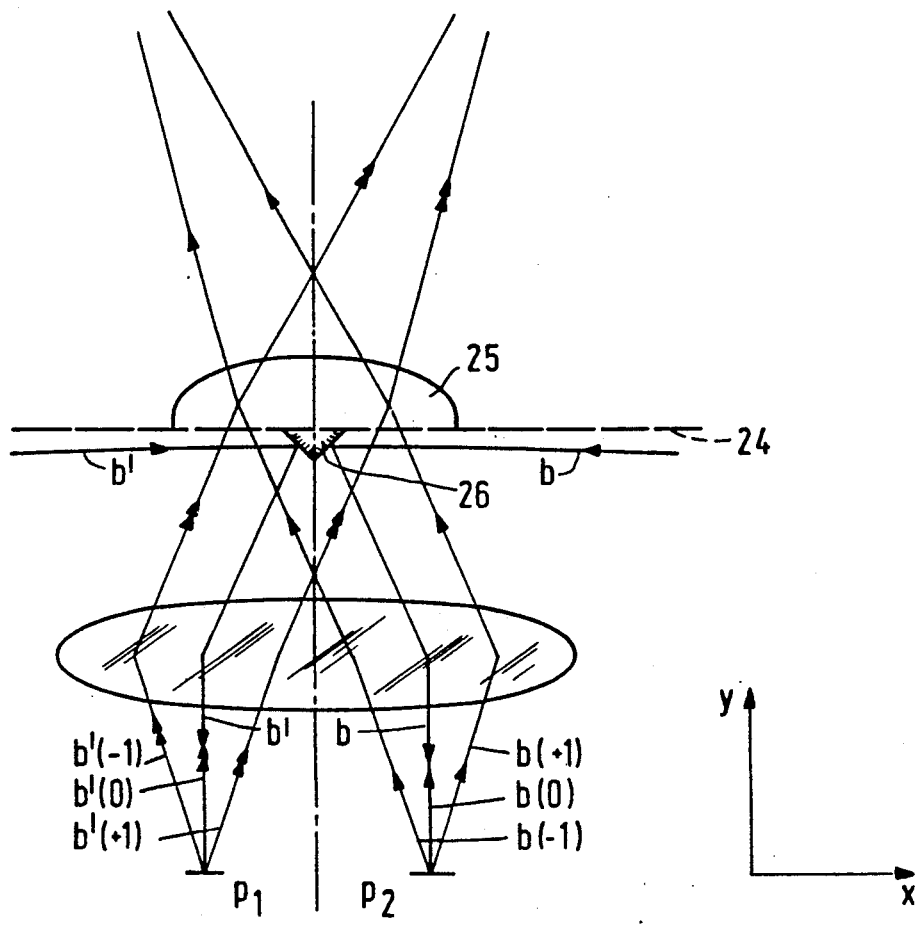

The effect of the correction lens 25 can be explained with reference to FIG. 4 which shows the part of the radiation path of the alignment beams between the correction lens and the substrate alignment marks. These marks are in the form of diffraction gratings. The alignment beam b incident on the grating $P_2$ is split into a zero order sub-beam b(0) which has the same direction as the beam b in the case of perpendicular incidence of the beam b, two sub-beams b(+1), b(−1) of the first order and a number of pairs of sub-beams of the third, fifth etc. orders. These sub-beams are reflected to the projection lens system. The first order sub-beams reach the correction lens 25 located in the plane 24. This lens has such a power that it changes the direction of the first order sub-beams b(−1) and b(+1) in such a way that the chief rays of these beams intersect one another in the plane of the mask alignment mark $M_2$. Moreover, the correction lens has such a small diameter that the higher order sub-beams which are diffracted by the mark $P_2$ through larger angles than the first order sub-beams do not pass through this lens. Furthermore, an element is arranged at the correction lens, which element prevents the zero order sub-beams b(0), b'(0) from passing through the correction lens. In the embodiment of FIG. 4 this element is in the form of a reflecting double wedge 26, which wedge is used to couple the alignment beams b and b' into the projection lens system. This wedge reflects the zero order sub-beams b(0) and b'(0) towards the incident alignment beams b and b', respectively. It is achieved by the said measures that only the first order sub-beams are used for imaging the grating $P_2$ on the grating $M_2$ so that some additional advantages are obtained.

The zero order sub-beam does not comprise information about the position of the grating $P_2$. The intensity of this sub-beam may be considerable as compared with the intensity of the first order sub-beam, dependent on the geometry of the grating, notably the depth of the grating grooves and the ratio between the width of these grooves and the width of the intermediate grating strips. By suppressing the zero order sub-beam the contrast in the image of $P_2$ can be increased considerably. Since the second and higher order sub-beams are suppressed, irregularities in the grating $P_2$ do not have any influence on the alignment signal. When using the first order sub-beams only, the second harmonic of the grating $P_2$ is imaged, as it were, i.e. apart from the magnification M of the projection lens system PL, the image of $P_2$ has a period which is half that of the grating $P_2$. If it is ensured that the grating period of the grating $M_2$ is equal to that of the image of $P_2$, i.e. equal to m/2 times the grating period of the grating $P_2$, the accuracy with which the gratings $M_2$ and $P_2$ are aligned is twice as large as in the case where the complete beam b is used for the imaging.

Under circumstances, particularly with a smaller difference between the wavelengths of the projection beam PB and an alignment beam b, b' and when using achromatic lens elements in the projection lens system, it may occur that the sub-beams having diffraction orders which are higher than one still reach the mask alignment mark $M_2$ via the projection lens system. In this case a diaphragm plate may be arranged in or proximate to the correction lens 25 which passes the first order sub-beams only.

Figure 5:
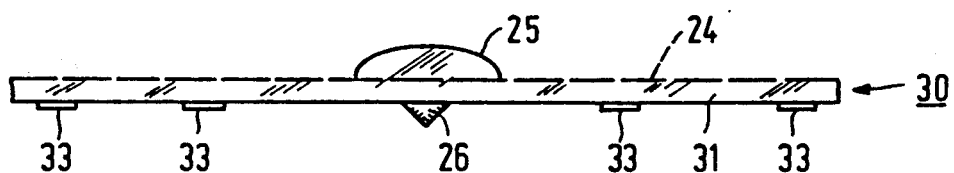
Figure 6:
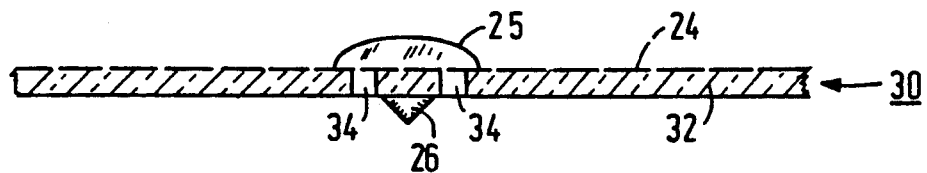

For the sake of clarity, two embodiments of this diaphragm plate 30 are separately shown in FIGS. 5 and 6. In FIG. 5 the material 31 of this plate is transparent to both the projection beam and the alignment beam and regions 33 blocking the radiation of the alignment beam are located on the plate 30 at those positions where portions of the alignment beam having diffraction orders which are higher than one reach the plate. These regions are small and they jointly cover only 5 to 10% of the surface area of the pupil of the projection lens system so that the regions 33 have a negligible influence on the projection beam. The material 31 may be of the same type as the material of the projection lens elements and the regions 33 may consist of an absorbing or a reflecting material.

The material 32 of the diaphragm plate of FIG. 6 is dichroic and transparent to the projection beam but opaque to the alignment beam. Now regions 34 passing the radiation of the alignment beam are provided in the layer 32 at those positions where the first order alignment sub-beams reach the diaphragm plate 30. This diaphragm plate provides the advantage that it does not present any obstacles to the projection beam and blocks the higher order sub-beams of the alignment beam more effectively.

Instead of a diaphragm arranged in the projection lens system, a diaphragm arranged between the projection lens system and the mask may be used to achieve image that the of a substrate alignment mark on a mask alignment mark observed by the detection system is brought about only by the first diffraction order portions of the alignment beam. This possibility is illustrated diagrammatically in FIG. 7. In this Figure the reference PL denotes the projection lens system and MA denotes the mask. The reference numeral 35 denotes a diaphragm plate which is opaque to the alignment beam but which has a transparent aperture 36 for the first order sub-beams of the alignment beam b' (not shown).

Figure 7:
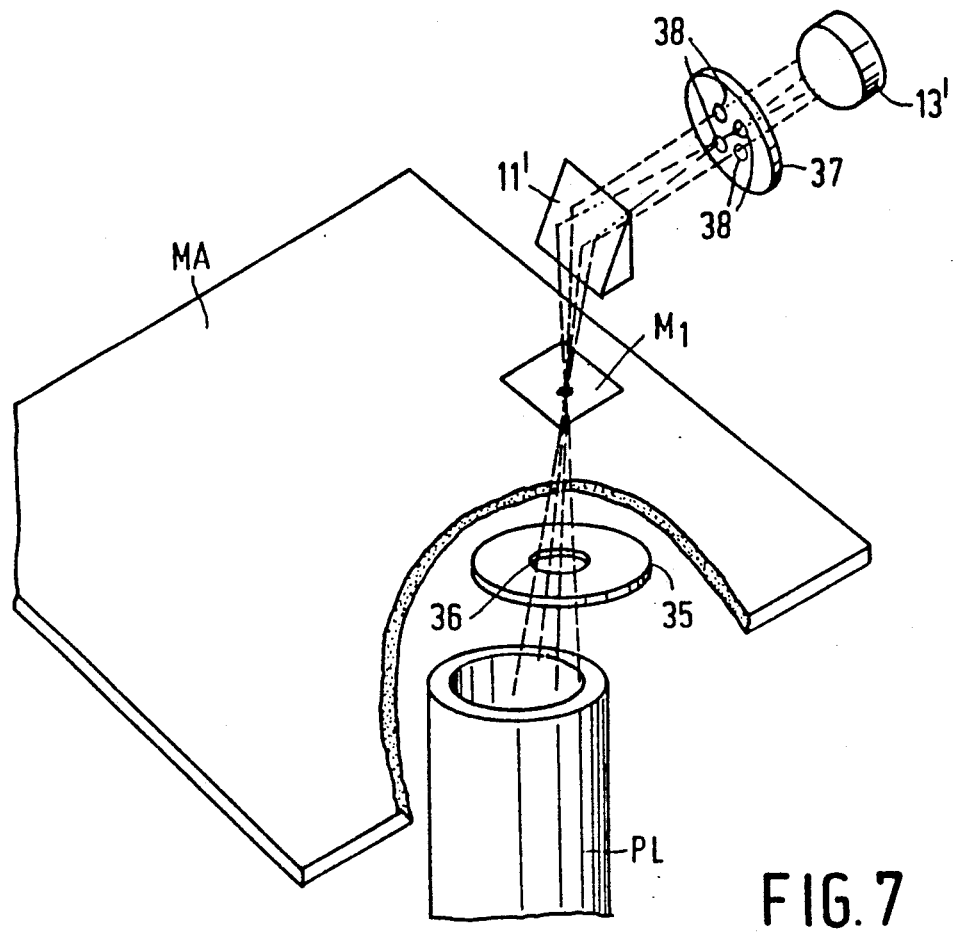

Since the diaphragm plate 35 is arranged behind the projection lens system and close to the image of the substrate alignment mark, it may occur that still radiation of the alignment beam which is diffracted in higher orders, notably in the third and fifth orders, passes through the aperture 36 and reaches the detection system 13'. To prevent this, a further diaphragm plate 37 with apertures 38 for the sub-beams of the alignment beam diffracted in the first orders by the substrate alignment mark and the associated mask alignment mark may be arranged between the mask MA and the detection system 13', as is also shown in FIG. 7.

Figure 8:
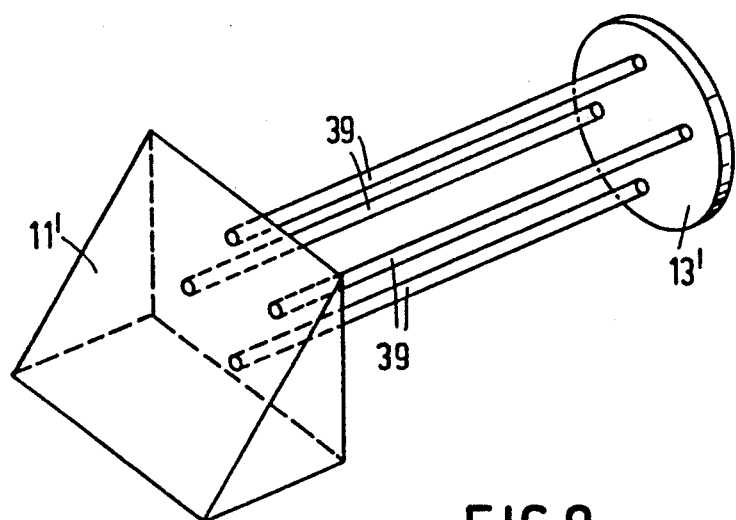

Instead of a second diaphragm plate 37, radiation-transparent pipes 39 may be arranged between the detection system 18' and, for example, the prism 11' as is shown diagrammatically in FIG. 8, which pipes ensure that only the portions of the alignment beam diffracted in the first orders reach the detection system 13'.

The correction lens 25 does not only ensure that an alignment beam is sharply focused on the mask plane, but it can also correct for the magnification error with which a substrate alignment mark is imaged on a mask alignment mark, which magnification error is a result of the fact that the projection lens system is designed for the wavelength of the projection beam and not for that of an alignment beam. This magnification error correction will be sufficient in many cases. In an apparatus in which a deep-ultraviolet beam having a wavelength of, for example, 248 nm is used as a projection beam, it may occur that the correction lens 25 cannot completely correct the magnification error. In this case an extra lens 9 may be arranged in the path of the alignment beam outside the projection lens system PL so as to eliminate the residual magnification error. The lens 9 has a maximum effect when it is arranged proximate to the substrate alignment mark or the mask alignment mark. Since in a projection apparatus the space between the mask and the projection lens system is larger than the space between this system and the substrate, the lens 9 is preferably arranged between the mask and the projection lens system as is shown in FIG. 3.

The alignment of the alignment marks $P_2$ and $M_2$ in the X direction by means of the first order sub-beams diffracted in the Y-Z plane has been described in the foregoing. When using two-dimensional diffraction gratings, as is shown in FIG. 2, sub-beams having the same diffraction orders as in the X-Z plane are also produced in the Y-Z plane. As is already shown in FIGS. 7 and 8, the first order sub-beams of these sub-beams can be filtered out and used for alignment in the Y direction. The same correction lens and diaphragm means as for the X alignment can then be used, the diaphragm means being made suitable for four instead of two sub-beams.

After description of the system $AS_1$, which is used for aligning the mask alignment mark $M_2$ with respect to a substrate alignment mark, the system $AS_2$, with which the mask alignment mark $M_1$ is aligned with respect to a substrate alignment mark, does not require any further explanation. The system $AS_2$ comprises similar elements and operates in the same way as the system $AS_1$. As already shown in FIG. 4, the correction lens 25 is common for the systems $AS_1$ and $AS_2$.

The accuracy with which the substrate alignment marks can be aligned with respect to the mask alignment marks is considerably enhanced by modulating the output signals of the detector 13 and 13' with a fixed frequency. To this end the mask M and hence, for example the mask mark $M_2$ can be periodically moved, as has been described in the Article in "SPIE", Vol. 470 "Optical Microlithography" III "Technology for the next Decade" 1984, pages 62-69. A better alternative for obtaining a dynamic alignment signal, described in U.S. Pat. No. 4,251,160, with which the accuracy of the alignment device according to the invention can also be enhanced is shown in FIG. 3.

Before reaching the mark $M_2$, the beam $b_1$ has traversed the polarisation-sensitive splitting prism 2 so that this beam is linearly polarised and has a given direction of polarisation. Subsequently the beam $b_1$ traverses a plate 8 of birefringent material, for example, quartz whose optical axis extends at an angle of 45° to the direction of polarisation of the beam leaving the prism 2. The element 8 may also be a Savart plate or a Wollaston prism. Two mutually perpendicularly polarised beams leave the plate 8, which beams are shifted with respect to each other at the location of the mask mark $M_2$ over a given distance which is determined by the geometry of the mark $M_2$. When using gratings as alignment marks, the said distance is equal to half the grating period of the grating $M_2$. A polarisation modulator 18 and a polarisation analyser 19 are arranged in front of the detector 13. The modulator 18, for example an elasto-optical modulator is controlled by a voltage $V_B$ which is supplied by a generator 20. The direction of polarisation of the beam passing through the modulator is thereby switched alternately through 90°. The analyser 19 has the same main direction, or pass direction as the polarisation sensitive splitting prism 2 so that alternately a first radiation beam having a first direction of polarisation, which beam has formed, for example a non-shifted image of $P_2$ on $M_2$, and a second radiation beam having a second direction of polarisation, which beam has formed, for example, an image of $P_2$ on $M_2$ shifted over half a grating period, are passed to the detector 13. The signal of the detector 13 is amplified and processed in a phase-sensitive detection circuit 21 to which also the signal $V_B$ is applied. The output signal $S_A$ is the desired dynamic aligning signal.

The modulator 18 and analyser 19 may alternatively be arranged in the radiation path in front of the mask alignment mark.

Figure 9:
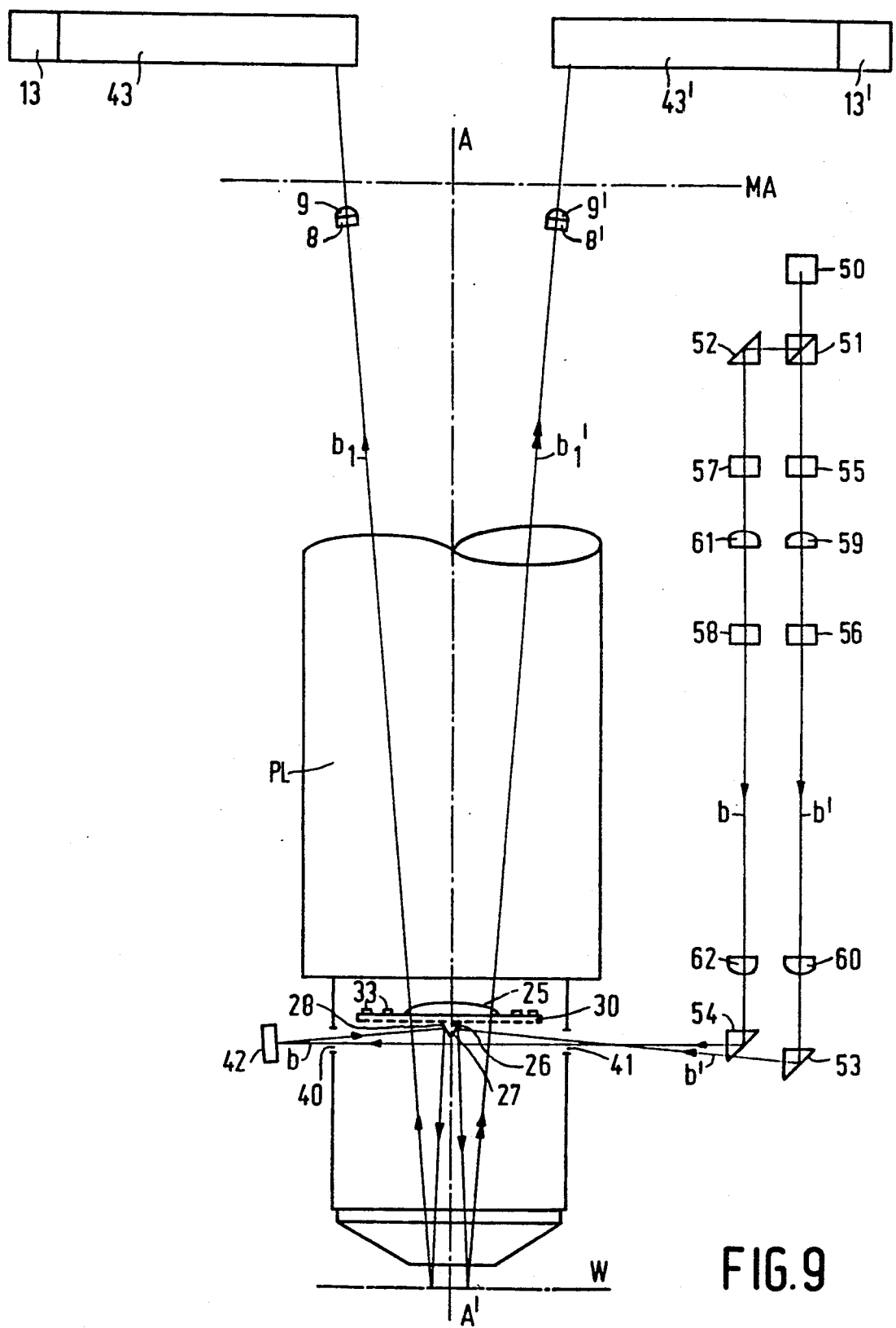

FIG. 9 shows a second embodiment of an apparatus using a double aligning system. The Figure only shows the components which are important for the present invention. The holder of the projection lens system PL has two radiation-transparent windows 40 and 41 through which the alignment beams b and b' enter. The alignment beams b and b' are incident on reflecting faces 27 and 28, respectively, of the reflecting prism 26 and are reflected towards the substrate W in which an alignment mark (not shown) is present. This mark splits the relevant alignment beam into a plurality of sub-beams of different diffraction orders. The zero order sub-beam is reflected to the exterior by the reflecting faces 27, 28. The first order sub-beams of the alignment beams $b_1$ and $b_1'$ are brought to interference in the plane of the mask MA by a correction lens 25 arranged above the prism 26, in which plane alignment marks (not shown) are present. The image of a substrate alignment mark formed by the first order sub-beams is observed, together with the associated mask alignment mark by radiation-sensitive detectors 13 and 13', respectively. Blocks 43 and 43' accommodating the elements 10, 11, 12, 14–19 and 10', 11', 12', 14'–19', respectively, shown in FIG. 3 are arranged in front of these detectors.

If necessary, the diaphragm means described with reference to FIGS. 5, 6, 7 and 8 may be arranged in the path of any one alignment beam.

Furthermore, extra lenses 9 and 9' may be arranged in the path of the alignment beams $b_1$ and $b_1'$ for correcting the magnification with which a substrate alignment mark is imaged on a mask alignment mark.

The alignment beams can be supplied by separate radiation sources. However, as is shown in FIG. 9, a common radiation source 50 is preferably used. The beam supplied by this source is split into two beams b and b' by a beam splitter 51. A reflector 53 reflects the alignment beam b' to the reflecting face 27 of the prism 26 via the radiation-transparent window 41. The alignment beam b also reaches the radiation-transparent window 41 via the reflectors 52 and 54. This beam leaves the holder of the projection lens system PL via the diametrically arranged second radiation-transparent window 40 and is subsequently reflected to the reflecting face 28 of the prism 26 by an extra reflector 42.

Extra elements in the form of plane-parallel plates 55, 56, 57 and 58 and lenses 59, 60, 61 and 62 may be arranged in the path of the beams b and b', which components ensure that the two beams are perpendicularly incident on the substrate as parallel beams.

The invention has so far been described with reference to an apparatus comprising two alignment devices, but it may be used to equal advantage in an apparatus comprising only one alignment device such as $AS_1$ in FIG. 3. An apparatus having a single alignment system is described in U.S. Pat. No. 4,251,160. However, the apparatus having a double alignment system is preferred because the relative angle orientation of the mask pattern and the substrate is directly laid down optically and because magnification errors of the projection lens system as well as deformations in the substrate and the mask can be measured.

It must be ensured that the correction lens arranged according to the invention does not essentially influence the projection beam PB, so that the quality of the image of the mask on the substrate is maintained. Since the correction lens 25 is arranged on the axis AA' of the apparatus and the surface area of this lens is, for example only one tenth of the cross-section of the projection beam, this requirement is amply met. As an extra measure the projection beam may be given an annular cross-section instead of the conventional round cross-section. To this end, for example the integrator (IN in FIG. 1) may have an annular shape, analogously as described in German Patent Specification No. 2,608,176.

Figures 10, 11:
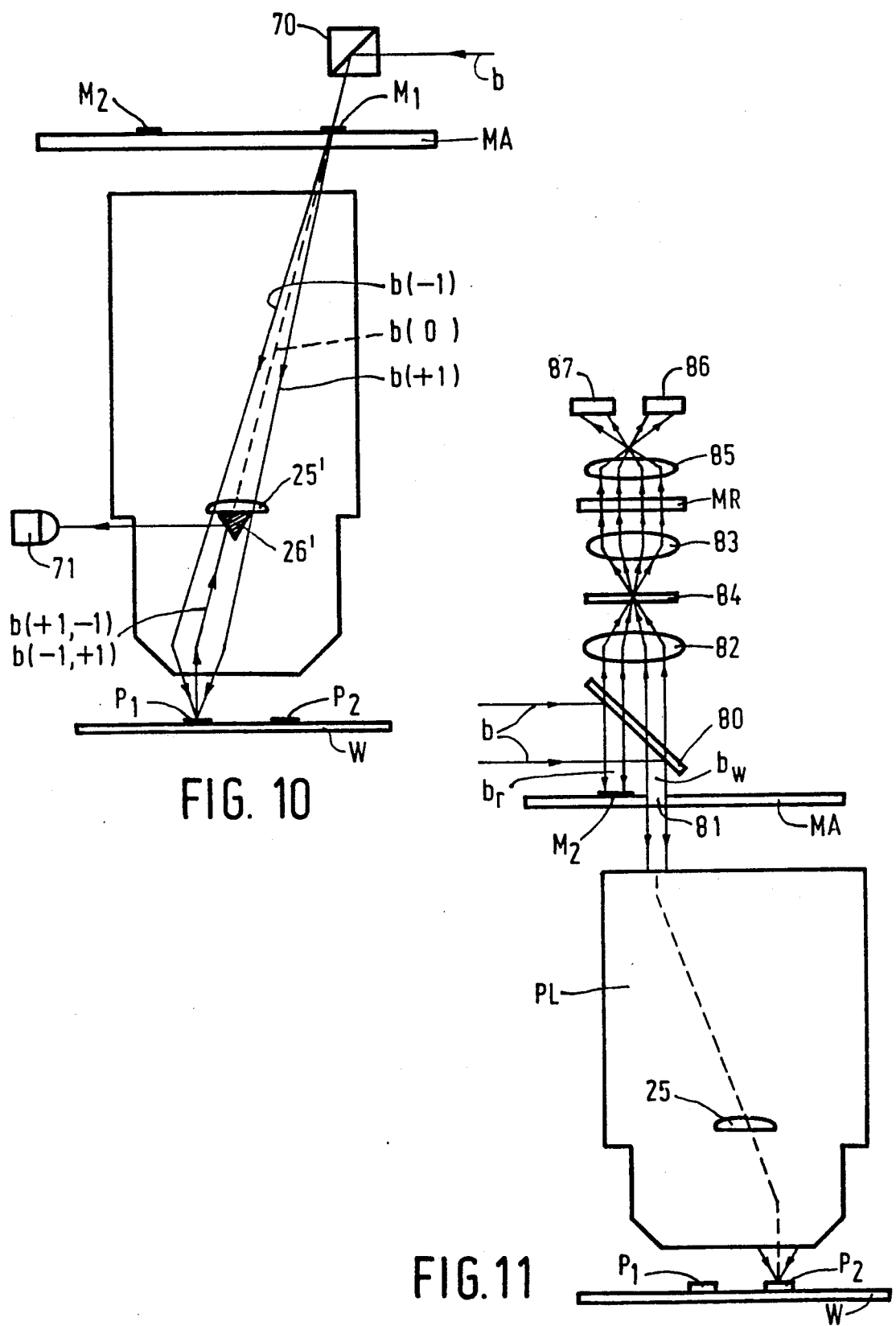

In the embodiments described with reference to FIGS. 4, 5, 6 and 9 a substrate alignment mark is projected on a mask alignment mark. However, the invention may be alternatively used in an alignment device in which a mask alignment mark is projected on a substrate alignment mark in the way as described, for example, in U.S. Pat. Nos. 4,778,275, 4,636,077 and 4,771,180. FIG. 10 shows diagrammatically such an alignment device in which the inventive idea is employed.

In this Figure, the reference MA again denotes a mask with mask alignment marks $M_1$ and $M_2$ and W denotes a substrate with alignment marks $P_1$ and $P_2$. PL is the projection lens system. A prism 70 reflects an alignment beam b towards the mask alignment mark $M_1$. The projection lens system PL images the mark $M_1$ on the substrate alignment mark $P_1$ by means of the radiation of the alignment beam b. The mask alignment mask diffracts the beam b in a zero-order sub-beam b(0), two first-order sub-beams b(−1), b(+1) denoted by broken lines and a plurality of higher order sub-beams which are not shown.

According to the invention, the projection lens system includes a correction element, for example, a lens 25' at a position where the sub-beams of the alignment beam are sufficiently separated, which element ensures that only the sub-beams b(−1) and b(+1) reach the mark $P_1$ and are focused thereon. Thus, a sharp image of the mark $M_1$ on the mark $P_1$ is formed by means of the first-order sub-beams b(−1) and b(+1) only. The sub-beam portions which are reflected by the substrate mark $P_1$ and diffracted in the +1 order and the −1 order, hence the double order sub-beams b(−1,+1) and b(+1,−1) have the same direction which is opposed to the direction of the sub-beam b(0) originating from the mark $M_1$. The sub-beams b(−1,+1) and b(+1, −1), which comprise information about the mutual positions of the marks $M_1$ and $P_1$, are reflected by a reflector 26' towards a detection system 71 whose output signals are a measure of the coincidence of the mark $P_1$ with the image of the mark $M_1$. The reflector 26' also blocks the zero-order sub-beam b(0) originating from the mark $M_1$.

The apparatus device shown in FIG. 10 may have two alignment devices analogous to the device of FIG. 3. Then a similar correction element 25' can be used for the first alignment beam b as well as for the second alignment beam b'. A reflector 26' reflecting on two sides then reflects also the double order sub-beams b'(−1,+1) and b'(+1,−1) of the second alignment beam b' to the left.

In the device of FIG. 10 beam modulator means similar to those described with reference to FIG. 3 and diaphragm means similar to those described with reference to FIGS. 5, 6, 7 and 8 can be used.

FIG. 11 shows very diagrammatically an embodiment of the projection apparatus in which a mask alignment mark $M_2$ and a substrate alignment mark $P_2$ are both projected on a third alignment mark $M_R$. In this apparatus an alignment beam b illuminates the mask alignment mark $M_2$ and a juxtaposed window 81 in the mask MA via a partly reflecting element 80, for example, a partly transparent mirror. The mask alignment mark reflects radiation towards the third alignment mark $M_R$. A lens 82 images the mark $M_2$ on the mark $M_R$, while only the sub-beams which are diffracted in the first orders by the mark $M_2$ participate in the projection. Thereby a Fourier lens system may be used which system comprises a first Fourier-transform, lens 82 in the back focal plane of which a filter plate 84 is arranged and a second Fourier-transform lens 83, which front focal plane coincides with the plane of the filter plate 84. The first lens 82 focuses the beam portion $b_r$ on the filter plate which passes only the first diffraction orders from the alignment mark $M_2$. The second lens 83 forms an image of the mark $M_2$ on a first portion of the third, or reference, alignment mark $M_R$. This portion and the superposed image of $M_2$ are imaged by a lens 85 on a first detector 86. The alignment beam portion $b_w$ passing through the window 81 illuminates the substrate alignment mark $P_2$ via the projection lens system PL. This projection lens system which, according to the invention, includes a correction lens 25, images the substrate alignment mark $P_2$ in the plane of the mask alignment mark $M_2$, while only the sub-beams diffracted in the first orders by the mark $P_2$ are used. The beam portion $b_w$ then passes through the lens 82, the filter plate 84 and the lens 83 is a similar way as the reflected beam portion $b_r$, so that the alignment mark $P_2$ is imaged on a second portion of the reference alignment mark $M_R$. This portion and the superposed image of $P_2$ are imaged by the lens 85 on a second detector 87. By comparing, for example, the phases of the output signals of these detectors, the extent of mutual alignment of the alignment marks $M_2$ and $P_2$ can be determined in a manner analogous to that described in U.S. Pat. No. 3,811,779.

FIG. 12a shows diagrammatically another possibility of indirectly aligning a mask alignment mark and a substrate alignment mark with respect to each other, in which method an artificial alignment mark instead of a physical alignment mark is used as the third mark. This third mark consists of an interference pattern IP formed by two beams $b_a$ and $b_b$ which interfere with each other in the plane of the mask alignment mark $M_2$. The principle of using an interference pattern for aligning a substrate alignment mark and a mask alignment mark with respect to each other is described in the article "Heterodyne Holographic Nanometer Alignment for a Wafer-stepper" in "Microcircuit Engineer" Programme and Abstracts Cambridge (GB), Sept. 28, 1989.

FIG. 12b shows the interference pattern IP which is superimposed on the mask alignment mark $M_2$ implemented as a reflective grating. This grating deflects the incident radiation in different diffraction orders into the direction of a first detector 92. A filter 91 passing only the first-order sub-beams is arranged in front of this detector. The output signal of the detector represents the position of the mark $M_2$ with respect to the interference pattern IP.

Next to the mark $M_2$ the mask MA has a window 94 passing radiation from the interfering beams $b_a$ and $b_b$ to the projection lens system PL. This system images the interference pattern IP on the substrate alignment mark $P_2$, as is shown in FIG. 12c. The mark $P_2$ implemented as a reflective grating deflects the incident radiation in a plurality of reflected diffraction orders. The reflected radiation reaches a second detector 97 via the projection lens system and a partly transparent prism 95. According to the present invention the projection lens system PL includes a correction element 25 which ensures that the interference pattern is sharply imaged on the mark $P_2$. A filter 96 for selecting the first-order sub-beams may be arranged between the detector 97 and the prism 95.

Analogously as is shown in FIG. 10, it is alternatively possible to arrange a reflector 26' below the correction element 25, which reflector reflects the first-order sub-beams to the right so that these beams can leave the projection lens via a window in the wall of the projection lens holder, as is denoted by the broken-line ray.

The beams $b_a$ and $b_b$ may be modulated beams, with the modulation frequency for the two beams being different. The interference pattern which is then formed varies with time so that it is simulated that the interference pattern moves across the mask alignment mark and across the substrate alignment mark, which results in periodically varying alignment signals. The difference between the phases of the output signals of the detectors 92 and 97 is then representative of the extent to which the marks $M_2$ and $P_2$ are mutually aligned.

The alignment devices shown in FIGS. 11 and 12 may be doubled, analogous to the devices shown in FIG. 3, they may comprise diaphragm means which are similar to those described with reference to FIGS. 5, 6, 7 and 8, and be provided with similar beam modulation means as shown in FIG. 3.

The fact that the alignment marks are diffraction gratings in the embodiments described does not mean that the invention is limited thereto. Also when aligning with marks in the form of radiation-transparent or reflecting strips, crosses or squares, a correction lens according to the invention may be used to image these marks in the correct position and with the desired magnification.

Since the described aligning device operates independently of the kind of pattern C which is present in the mask M, the invention may be used whenever a very fine, detailed pattern must be transferred onto a substrate and when this pattern must be aligned very accurately with respect to the substrate. Examples are apparatuses which are used for the manufacture of integrated optical systems or of magnetic domain memories. The apparatus with which the pattern is projected need not be a repetitive projection apparatus. The invention may also be useful in an apparatus in which a pattern is projected on a substrate only once.

We claim:

1. An apparatus for projecting a mask pattern on a substrate, which apparatus successively comprises an illumination system for supplying a projection beam, a mask holder, a projection lens system and a substrate holder and which further comprises a device for aligning a substrate alignment mark with respect to a mask alignment mark, said device comprising a radiation source supplying an alignment beam, the projection lens system and a radiation-sensitive detection system in the path of alignment beam portions which have been in interaction with the substrate alignment mark and the mask alignment mark, the output signals of the detection system being a measure of the mutual position of the alignment marks, characterized in that a refractive correction element is arranged in the path of the alignment beam and in the projection lens system, the dimension of said correction element being smaller than the diameter of the projection lens system in the plane of said element such that the quality of the image of the mask on the substrate is maintained, said correction element deflecting and focusing only sub-beams of the alignment beam which are deflected in the first diffraction orders by a first alignment mark onto a second alignment mark.

2. An apparatus as claimed in claim 1, characterized in that the refractive correction element is arranged in the Fourier plane of the projection lens system.

3. An apparatus as claimed in claim 2, characterized in that the refractive correction element is a lens.

4. An apparatus as claimed in claim 1, 2 or 3, characterized in that an extra lens for correcting the magnification with which the first alignment mark is imaged on the second alignment mark is arranged in the radiation path of the alignment beam between the first and second alignment marks and outside the projection lens system.

5. An apparatus as claimed in claim 4, characterized in that the extra lens is arranged proximate to the first alignment mark or proximate to the second alignment mark.

6. An apparatus as claimed in claim 5, characterized in that the extra lens is arranged between the projection lens system and a mask alignment mark.

7. An apparatus as claimed in claim 1, 2 or 3, characterized in that a diaphragm is arranged in the projection lens system, which diaphragm blocks those portions of the alignment beam coming from the first alignment mark which have diffraction orders which are higher than one.

8. An apparatus as claimed in claim 7, characterized in that the diaphragm is constituted by a layer which is transparent to the projection beam and the aligment beam, which layer has regions blocking the radiation of the alignment beam at those positions where the portions of the alignment beam with diffraction orders higher than one reach said layer.

9. An apparatus as claimed in claim 7, characterized in that the diaphragm is constituted by a layer of dichroic material which is transparent to the projection beam and opaque to the alignment beam, which layer has regions which are transparent to the alignment beam at those positions where the first diffraction order portions of the alignment beam reach said layer.

10. An apparatus as claimed in claim 1, 2 or 3, characterized in that a diaphragm is arranged between the projection lens system and the second alignment mark, which diaphragm is transparent to radiation in the region where the portions of the alignment beam diffracted in the first orders by the first alignment mark reach said diaphragm.

11. An apparatus as claimed in claim 10, characterized in that a diaphragm system, which only passes the portions of the alignment beam diffracted in the first orders by the first alignment mark and the second alignment mark to the radiation-sensitive detection system, is arranged between the second alignment mark and said detection system.

12. An apparatus as claimed in any one of claims 1, 2 or 3, characterized in that the illumination system supplies a projection beam which has an annular cross-section in the plane of the correction element in the projection lens system.

13. An apparatus as claimed in any one of claims 1, 2 or 3, characterized in that the first alignment mark is a mask alignment mark and the second alignment mark is a substrate alignment mark, and in that a reflector is arranged in the path of alignment sub-beam portions, which are diffracted firstly by the mask alignment mark in the first orders and subsequently by the substrate alignment mark in the first orders, said reflector only reflecting said alignment sub-beam portions towards a detection system.

14. An apparatus as claimed in any one of claims 1, 2 or 3, characterized in that the second alignment mark is formed by a further alignment mark located outside the substrate and in that a mask alignment mark as well as a substrate alignment mark are a first alignment mark, both of which are projected on the further mark.

15. An apparatus as claimed in any one of claims 1, 2 or 3, characterized in that the radiation source of the alignment device supplies two radiation beams forming an interference pattern in the plane of the mask alignment mark and in the plane of the substrate alignment mark, in that the first alignment mark is formed by a part of said interference pattern and in that the second alignment mark is formed by a substrate alignment mark.

16. An apparatus as claimed in any one of claims 1, 2 or 3, characterized in that the first alignment mark is a substrate alignment mark and the second alignment mark is a mask alignment mark, and in that a reflector for reflecting the alignment beam towards the substrate alignment mark is arranged between the correction element and said mark.

17. An apparatus as claimed in claim 16, characterized in that the correction element is located in the rear focal plane of the projection lens system.

18. An apparatus as claimed in claim 16, in which a reflector is arranged between a mask table and the projection lens system for reflecting the alignment beam into the projection lens system, characterized in that a diaphragm system, which blocks the portions with diffraction orders of more than one as well as the zero order portion of the alignment beam coming from a substrate alignment mark, is arranged between the projection lens system and the detection system.

19. An apparatus as claimed in claim 16, characterized in that a holder of the projection lens system has a radiation transparent window through which an alignment beam can enter transversally with respect to the optical axis of said system and in that a reflector for reflecting a entering alignment beam to the substrate table is arranged is the projection lens system.

20. An apparatus as claimed in claim 16, characterized in that the reflector has a first and second reflecting face for reflecting the first and second alignment beam, respectively, to a substrate table, said faces extending at equally large but opposite angles to the optical axis of the projection lens system and in that a holder of the projection lens system has two radiation-transparent windows situated opposite the said reflecting faces.

21. An apparatus as claimed in claim 20, characterized in that first and second alignment devices have one common radiation source for supplying two alignment beams which reach one and the same radiation-transparent window in the holder of the projection lens system from different directions, whereafter one of the alignment beams is directly incident on one of the reflecting faces, while the other alignment beam leaves the said holder via a second radiation-transparent window and is indicent on an additional reflector which reflects said alignment beam to the second reflecting face.

22. An apparatus as claimed in claim 13, comprising a first and a second alignment device, characterized in that the first and the second alignment device have a reflector in common for reflecting beam portions of double diffraction orders $(+1, -1)$ and $(-1, +1)$ of the alignment beams towards associated detection systems, the first and the second number of the diffraction orders being associated with a mask alignment mark and a substrate alignment mark, respectively.

23. Apparatus as claimed in claim 14, characterized in that the further alignment mark is arranged at the side of a mask remote from the projection lens system, that the mask alignment mark is reflective and that the mask comprises a transparent window in the vicinity of said mark for passing alignment radiation towards the substrate alignment mark and alignment radiation reflected by the latter mark.

24. Apparatus as claimed in claim 23, characterized in that a Fourier lens system is arranged between the mask and the further alignment mark, a spatial filter being included in the Fourier lens system.

25. Apparatus as claimed in claim 23, characterized in that in the path of the alignment radiation behind the further alignment mark two detectors are arranged for capturing radiation from the mask alignment mark and the substrate alignment mark respectively.

26. Apparatus as claimed in claim 25, characterized in that an imaging lens is arranged between the further alignment mark and the two detectors.

27. Apparatus as claimed in claim 24, characterized in that between the Fourier lens system and the mask a partly transmissive reflector is arranged for reflecting the alignment beam towards the mask and for transmitting alignment radiation reflected from the mask alignment mark and the substrate alignment mark towards the further alignment mark.

28. An apparatus as claimed in any one of claims 1, 2 or 3, characterized in that a substrate and a mask alignment mark has the form of a phase and an amplitude diffraction grating, respectively.

29. An apparatus as claimed in any one of claims 1, 2 or 3, characterized in that means controlled by periodical signals are arranged in the path of an alignment beam for periodically displacing a second alignment mark observed by the detection system and an image on said mark of a first alignment mark with respect to each other.

30. An apparatus as claimed in claim 13, wherein said device for aligning said mask alignment mark with respect to said substrate alignment mark includes a first device for aligning a first mask alignment mark with respect to said substrate alignment mark as well as a second device for aligning a second alignment mark with respect to said substrate alignment mark by means of a second alignment beam, characterized in that the first and second alignment devices have one common correction element.

31. An apparatus as claimed in claim 14, wherein said device for aligning said mask alignment mark with respect to said substrate alignment mark includes a first device for aligning a first mask alignment mark with respect to said substrate alignment mark as well as a second device for aligning a second alignment mark with respect to said substrate alignment mark by means of a second alignment beam, characterized in that the first and second alignment devices have one common correction element.

32. An apparatus as claimed in claim 15, wherein said device for aligning said mask alignment mark with respect to said substrate alignment mark includes a first device for aligning a first mask alignment mark with respect to said substrate alignment mark as well as a second device for aligning a second alignment mark with respect to said substrate alignment mark by means of a second alignment beam, characterized in that the first and second alignment devices have one common correction element.

33. An apparatus as claimed in claim 16, wherein said device for aligning said mask alignment mark with respect to said substrate alignment mark includes a first device for aligning a first mask alignment mark with respect to said substrate alignment mark as well as a second device for aligning a second alignment mark with respect to said substrate alignment mark by means of a second alignment beam, characterized in that the first and second alignment devices have one common correction element.

34. An apparatus as claimed in claim 1, wherein said device for aligning a substrate alignment mark with respect to a mask alignment mark includes a first and second alignment device for aligning a substrate alignment mark with respect to a mask alignment mark, said first and second alignment devices having one common correction element.

* * * * *